United States Patent [19]

Minato et al.

[11] Patent Number: 4,747,082

[45] Date of Patent: May 24, 1988

[54] SEMICONDUCTOR MEMORY WITH AUTOMATIC REFRESH MEANS

[75] Inventors: Osamu Minato; Toshiaki Masuhara, both of Tokyo; Katsuhiro Shimohigashi, Musashimurayama; Shoji Hanamura, Kokubunji; Shigeru Honjyo, Hachioji; Nobuyuki Moriwaki, Kodaira; Fumio Kojima, Higashiyamato, all of Japan

[73] Assignees: Hitachi Ltd.; Hitachi VLSI Eng. Corp., both of Tokyo, Japan

[21] Appl. No.: 76,174

[22] Filed: Jul. 21, 1987

Related U.S. Application Data

[63] Continuation-in-part of Ser. No. 801,765, Nov. 26, 1985.

[30] Foreign Application Priority Data

Nov. 28, 1984 [JP] Japan .............................. 59-249551
Nov. 28, 1984 [JP] Japan .............................. 59-249552
Jul. 21, 1986 [JP] Japan .............................. 61-169693

[51] Int. Cl.[4] ................................................ G11C 8/00
[52] U.S. Cl. ..................................... 365/222; 365/230
[58] Field of Search ...................... 365/222, 189, 230

[56] References Cited

U.S. PATENT DOCUMENTS 4,547,867 10/1985 Reese et al. ......................... 365/189
4,581,718 4/1986 Oishi ................................... 365/230
4,616,342 10/1986 Miyamoto .......................... 365/230

FOREIGN PATENT DOCUMENTS 148989 2/1978 Japan .

OTHER PUBLICATIONS

ISSCC Digest of Technical Papers—Feb. 23, 1984, pp. 216, 217 & 341.

Primary Examiner—James W. Moffitt
Attorney, Agent, or Firm—Antonelli, Terry & Wands

[57] ABSTRACT

A semiconductor memory is provided with automatic refresh means including a timer, a refresh counter and a refresh buffer each formed on a semiconductor chip mounted with an asynchronous memory, for automatically performing a periodic refresh operation on the basis of a basic clock signal which is generated in response to the detection of a logical change in the output of the refresh counter. The automatic refresh counter includes means for performing one of a read operation and a write operation which are based upon a regular address signal asynchronous with the periodic refresh operation, in preference to the periodic refresh operation.

11 Claims, 18 Drawing Sheets

F I G. 1
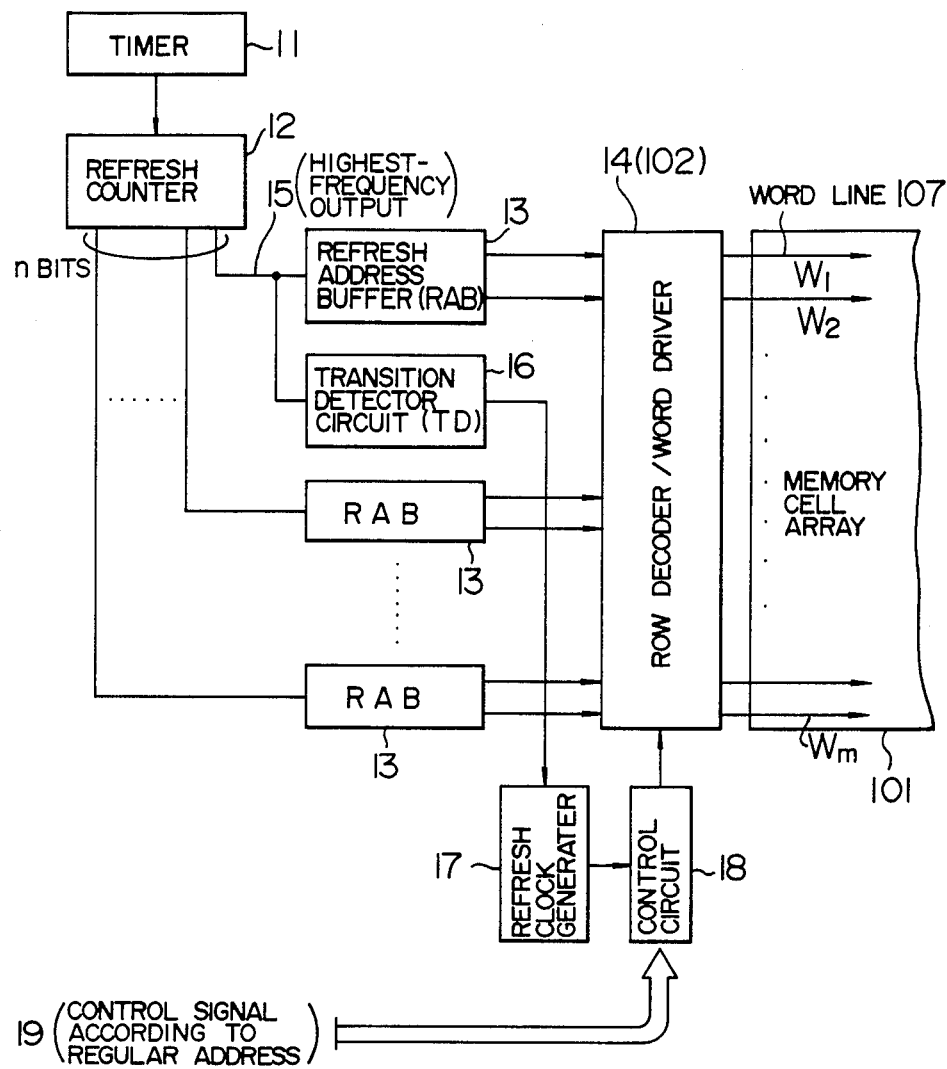

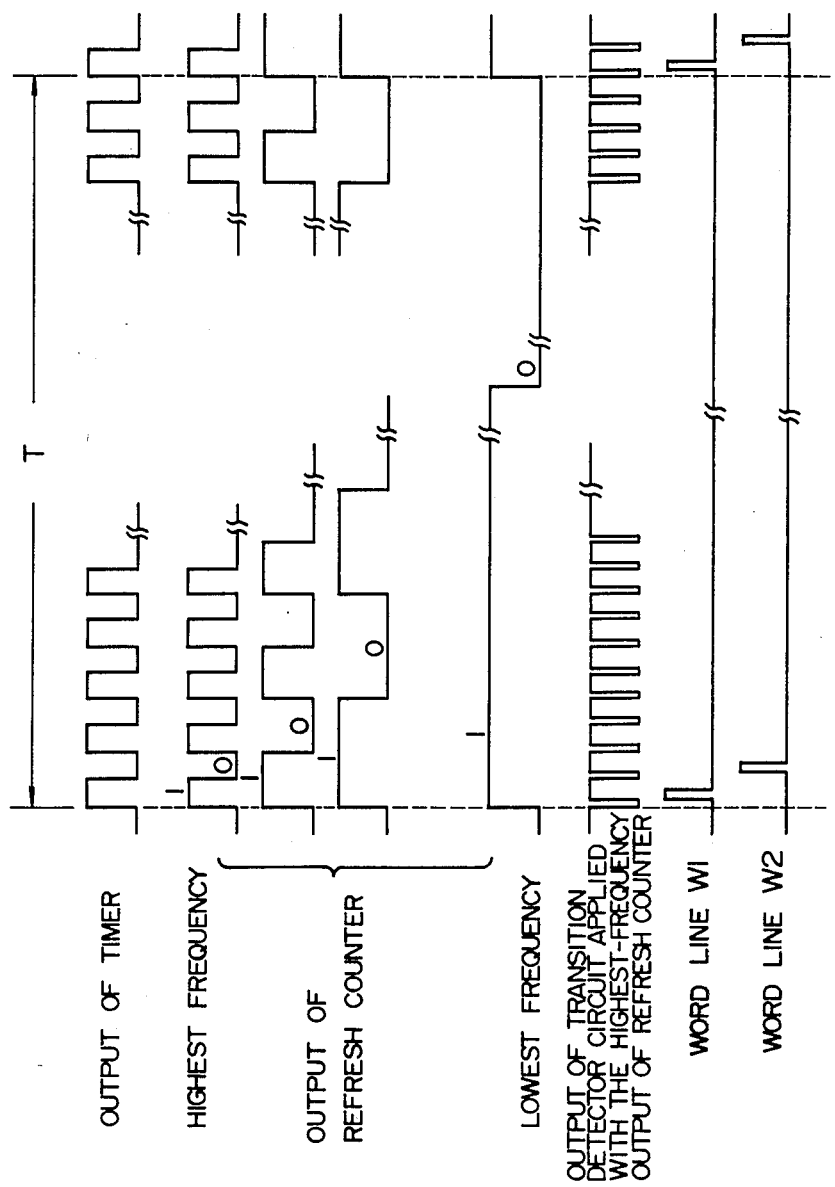

F I G. 3A
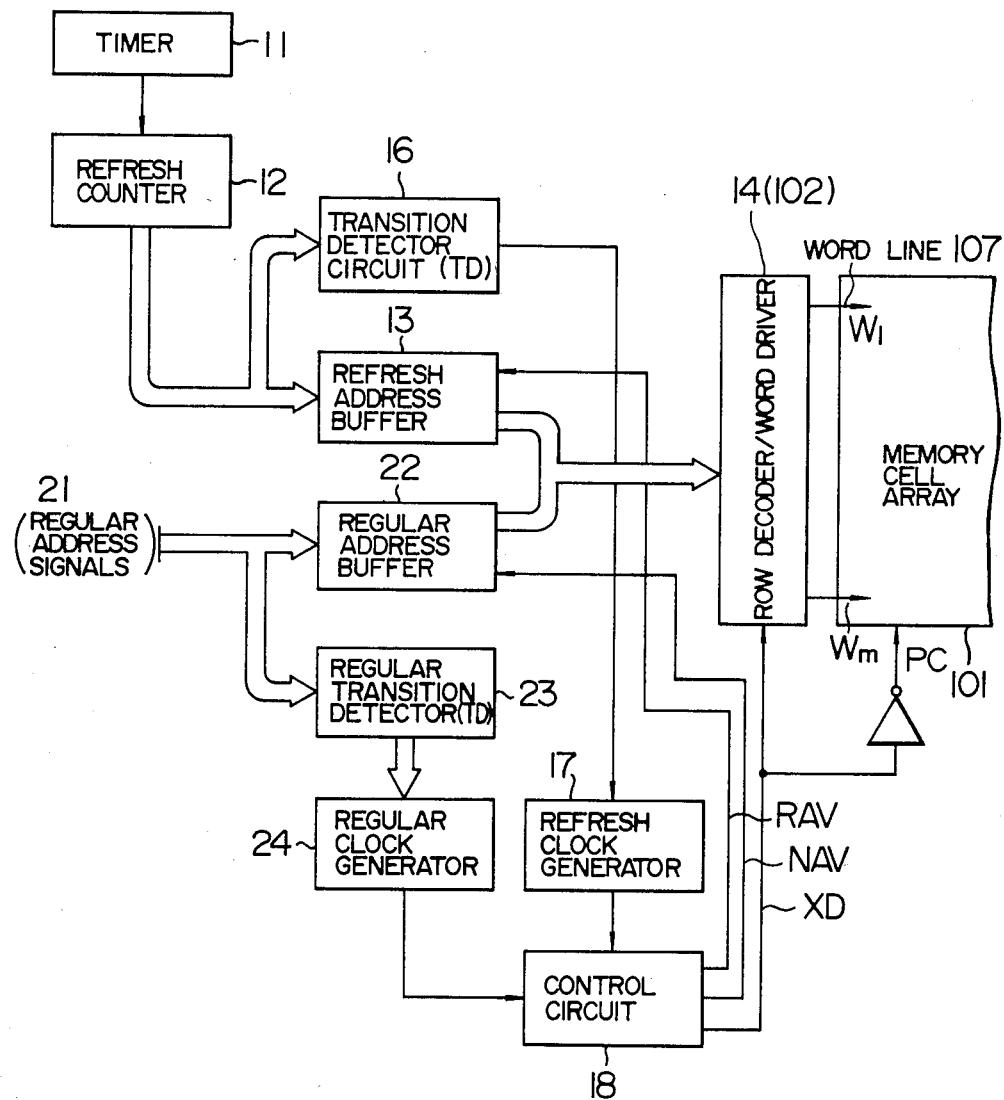

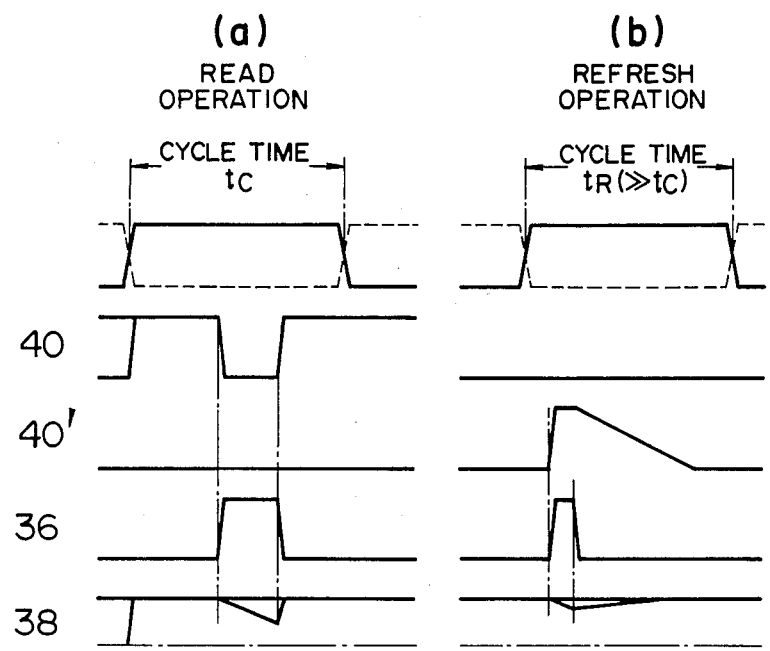

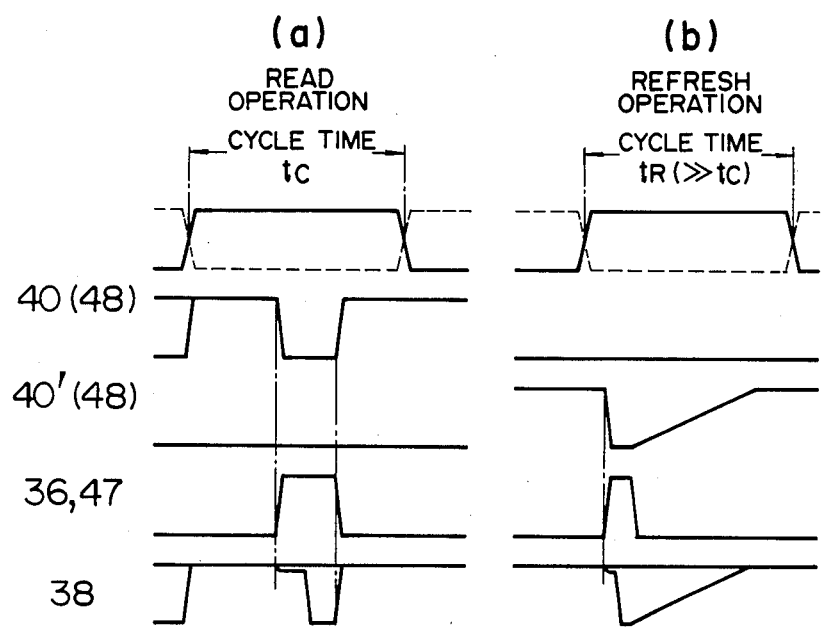

SEMICONDUCTOR MEMORY WITH AUTOMATIC REFRESH MEANS

CROSS REFERENCE TO OTHER APPLICATIONS

This application is a continuation-in-part of an application Ser. No. 801,765 filed on Nov. 26, 1985.

BACKGROUND OF THE INVENTION

The present invention relates to a memory device, and more particularly to a MOS random access memory which is so small in power consumption that it is possible to use a battery back-up for the memory.

In a conventional static memory, as described on pages 216, 217, and 341 of the February 1984 issue of the ISSCC Digest of Technical Papers and in a Japanese patent application specification (Publication No. 53-148989), each static memory cell is made up of six elements which include two load resistors for retaining data stored in the memory cell, and data can be read out from or written in a memory cell only by supplying the memory with an external address signal for specifying the memory cell. In other words, the conventional static memory is an asynchronous memory, which does not require any external control clock signal and hence is easy to use. Accordingly, the asynchronous memory is suited for forming a smallsized memory system. Further, the load resistor of the memory cell has a resistance of the order of $10^{10}\Omega$, and a stand-by current less than 10 μA per chip (for example, a stand-by current of 2 μA for a supply voltage of 5 V) can be realized for a memory including 64K bits per chip. Thus, the battery back-up can be made for the above memory. However, the conventional static memory has the following drawbacks, thereby making it impossible to fabricate a static memory which has a higher integration density than usual, and for which the battery back-up can be made. FIG. 9 shows a conventional static memory cell. In FIG. 9, reference numerals 1 and 2 designate transfer transistors each formed of an n-channel MOS transistor, 3 and 4 driver transistors each formed of an n-channel MOS transistor, 5 and 6 data lines, 7 a word line, 8 and 9 data storing nodes, 10 a ground line having a potential $V_{ss}$, 111 a power source line having a potential $V_{cc}$, and 112 and 113 load resistors. The data at the nodes 8 and 9 is maintained by supplying a current from the power source line 111 to each node. The same polysilicon layer as used for forming the gates of the MOS transistors 1 to 4 or a laminated polysilicon layer different from the polysilicon layer used for forming the above gates, is used for forming the load resistors 112 and 113, and part of the polysilicon layer or laminated polysilicon layer is left as an intrinsic or low-doped semiconductor region in order for the load resistors 112 and 113 to have a desired resistance value.

The memory cell of FIG. 9 has the following drawbacks. Firstly, the resistance value of each of the load resistors 112 and 113 varies greatly depending upon manufacturing conditions, and is difficult to control. Further, the above resistance value varies non-linearly with the voltage applied across the load resistor. In order to reduce the power consumption of a large static RAM (including 256k bits or 1M bits per chip) so that the battery back-up can be made for the RAM, that is, in order for the RAM to have a stand-by current of 2 μA for a supply voltage of 5 V, it is necessary to make the resistance value of a load resistor four or sixteen times larger than the resistance value now used. In this case, however, there arises a problem mentioned below. A load resistor connected to a high-potential node which has to be supplied with a current, has a small terminal voltage. Owing to the above-mentioned non-linear variation of the resistance value of a load resistor with the voltage applied across the load resistor, the resistance value of the load resistor on the high-potential node side becomes larger than the resistance value thereof in a case where a supply voltage of 5 V is applied across the load resistor, by about one order of magnitude. In other words, a current supplied to the high-potential node is smaller, as compared with a case where a supply voltage of 5 V is applied across the load resistor on the low-potential node side, by about one order of magnitude, and in the above case becomes nearly equal to a leak current at a connecting point of the high-potential node. Thus, the memory cell cannot retain data statically.

Secondly, the resistance value of the load resistor is greatly dependent on the scaling principle of MOS device. The inventors' experiment on the load resistor formed of an intrinsic polysilicon layer, showed that when the length of the load resistor was made less than 4 μm, a punch-through current flowed through the load resistor, and thus it was impossible to keep the low current characteristics. That is, even when the MOS transistors included in a memory cell are made small in size to make small the area occupied by the memory cell, it is impossible to make small the size of the load resistor which is indispensable for the memory cell. As mentioned above, it is impossible to realize a static RAM which is large in the number of bits per chip, and for which the battery back-up can be made.

Thirdly, the memory cell is made up of six elements, and hence is large in size. This also makes it difficult to fabricate a static RAM which is large in the number of bits per chip.

A conventional dynamic memory is made up of memory cells each of which does not include a load resistor for retaining data, and hence is small in size. Accordingly, the dynamic memory can be made large in the number of bits per chip. However, each memory cell of the dynamic memory is a volatile cell, and hence a refresh operation has to be made for the memory cell. Accordingly, an external control signal for the refresh operation is indispensable for the dynamic memory, and thus the dynamic memory is obliged to be a synchronous memory, which is hard to use.

SUMMARY OF THE INVENTION

An object of the present invention is to provide a semiconductor memory which can solve the above-mentioned drawbacks of the prior art, can retain data statically, and is so small in power consumption that it is possible to use a battery back-up for the memory.

Another object of the present invention is to provide an asynchronous semiconductor memory which is large in the number of bits per chip.

In order to attain the above objects, according to the present invention, there is provided a highintegration semiconductor memory in which each memory cell is a volatile cell so that it is not necessary to include current supply means for retaining data automatic refresh means for refreshing the data of each memory cell at a predetermined interval is provided on a semiconductor chip on which the semiconductor memory is formed, to make the volatile memory cell non-volatile and to reduce the power consumption of the memory so that the battery back-up can be made for the memory a data reading or data writing operation is first performed and then a refresh operation is performed, when the data reading or data writing operation for a memory cell and the refresh operation for the memory cell occur at the same time.

BRIEF DESCRIPTION OF THE DRAWINGS

FIG. 1 is a block diagram showing an automatic refresh circuit according to the present invention.

FIG. 2 is a timing chart for explaining the operation of the automatic refresh circuit of FIG. 1.

FIG. 3A is a block diagram showing an embodiment of a semiconductor memory according to the present invention.

FIG. 19, parts (a) and (b) is a waveform chart for explaining the operation of the circuit of FIG. 18.

FIG. 21, parts (a) and (b) is a waveform chart for explaining the operation of the circuit of FIG. 20.

DESCRIPTION OF THE PREFERRED EMBODIMENT

Figure 10:
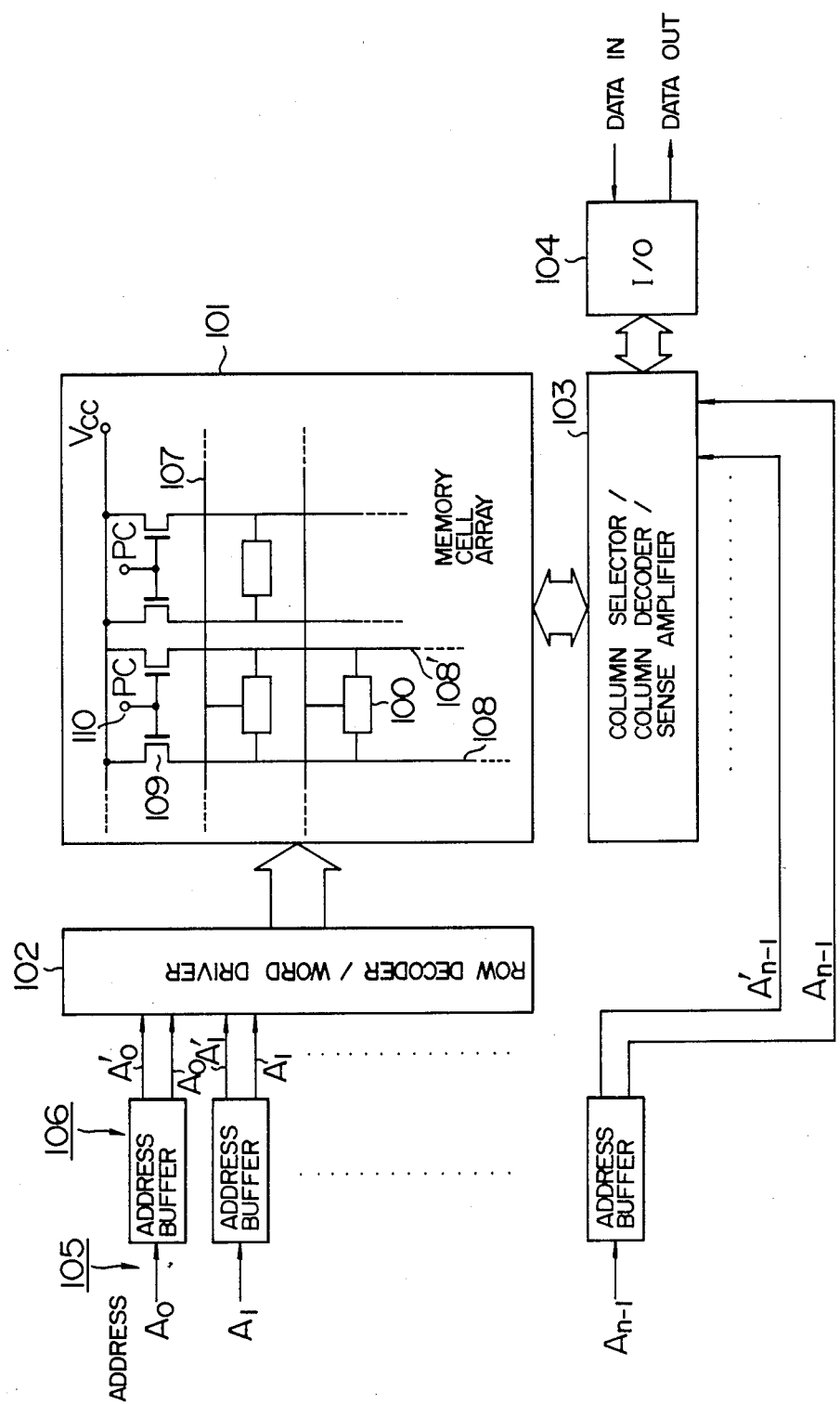
FIG. 10 is a block diagram showing the basic construction of a RAM.

FIG. 10 shows the basic construction of a RAM, to which the present invention is applied. In FIG. 10, reference numeral 101 designates a memory cell array in which memory cells 100 are arranged in the form of a matrix, 102 a row addressing part including a row decoder and a word driver, 103 a column addressing part including a column decoder, a column selector and a sense amplifier, 104 an input/output circuit for receiving and delivering data, 106 an address buffer for converting an address signal 105 into positive and negative signals, 107 a word line, 108 and 108' a pair of data lines, 109 a load MOS transistor connected to a data line, and 110 a terminal applied with a precharge signal PC. Incidentally, reference symbol $V_{cc}$ designates a supply voltage which is applied to the data lines through the load MOS transistors 109.

Now, the present invention will be explained below in detail, by reference to FIGS. 1, 2, 3A, 3B and 4.

FIG. 1 shows, in block diagram form, an automatic refresh circuit according to the present invention, and FIG. 2 is a timing chart for explaining the operation of the automatic refresh circuit. Referring to FIGS. 1 and 2, a refresh counter 12 has n output bits, and hence can generate n pulse signals which are different in frequency from each other, on the basis of the pulse output of a timer 11. The pulse signals thus obtained correspond address signal for successively selecting word lines $W_1$, $W_2$ ... and $W_m$ in a row decoder, and hence are hereinafter after referred to as "refresh address signals". The number n of output bits of the refresh counter 12 is determined by the number m $(=2^n)$ of word lines $W_1$ to $W_m$ to be selected. In a case where 256 $(=2^8)$ word lines are selected, it is necessary for the refresh counter 12 to have eight output bits. Each refresh address signal can take logical levels "1" and "0", and each of 256 word lines is specified by a refresh address which is formed of a combination of respective logical levels of eight refresh address signals. For example, the word line $W_1$ is specified by a refresh address (1, 1, ..., 1), and the word line $W_2$ is specified by a refresh address (0, 1, ..., 1). Each of the refresh address signals from the refresh counter is divided by a refresh address buffer 13 into positive and negative signals, which are sent to a row decoder 14. The frequencies of the refresh address signals are determined so that all of the word lines $W_1$ to $W_m$ can be selected in a refresh cycle T. One of the refresh address signals outputted from the refresh counter 12 which has the highest frequency, that is, a refresh address signal 15 is applied to a transition detector circuit 16, the output of which is applied to a refresh clock generator 17 for generating a basic clock for refresh operation. In more detail, each time the level of the refresh address signal 15 applied to the transition detector circuit 16 varies, that is, the refresh address is varied, the refresh clock generator 17 generates an internal clock, namely, a basic clock for causing a refresh operation. The basic clock is applied to the row decoder 14 through a control circuit 18, to activate the row decoder 14, thereby making it possible to select a predetermined word line. The control circuit 18 receives the basic clock for refresh operation and a control signal 19 which is generated in accordance with a regular address and is necessary for a regular operation (namely, a read or write operation), to generate a plurality of activation signals. Such a control method has advantages that when a refresh address is changed over to another refresh address to refresh another memory cell, the row decoder 14 is activated and a desired word line is selected, only by a basic clock pulse resulting from the change of refresh address, and that the width of the basic clock pulse can be determined independently of the pulse width of the refresh address signal 15 having the highest frequency, and the width of a pulse signal applied to the desired word line can be freely determined. The above control method plays an important role when a read or write operation for a memory cell based upon regular address signals asynchronous with a periodic refresh operation and a refresh operation for the memory cell occur at the same time. In other words, a semiconductor memory according to the present invention can operate as an asynchronous memory by using the abovementioned refresh system.

FIG. 3A shows, in block diagram form, an embodiment of a static semiconductor memory according to the present invention, in which the regular operation based upon regular address signals and the refresh operation can be performed in a favorable manner. In FIG. 3A, the timer 11, the refresh counter 12, the refresh address buffer 13, the transition detector circuit 16 and the refresh clock generator 17 are the same as those in FIG. 1. In the present embodiment, in order to perform the regular operation of static memory, each of regular address signals 21 is converted by a regular address buffer 22 into a decoder input signal, and a logical change in each regular address signal is detected by a regular transition detector circuit 23, the output of which is applied to a regular clock generator 24, to generate an internal clock, that is, a basic clock for regular operation. The basic clock for regular operation and the basic clock for refresh operation are both applied to the control circuit 18, which generates a signal XD for activating the row decoder 14, thereby selecting one of word lines, a regular address activation signal NAV, and a refresh address activation signal RAV.

Figure 3B:
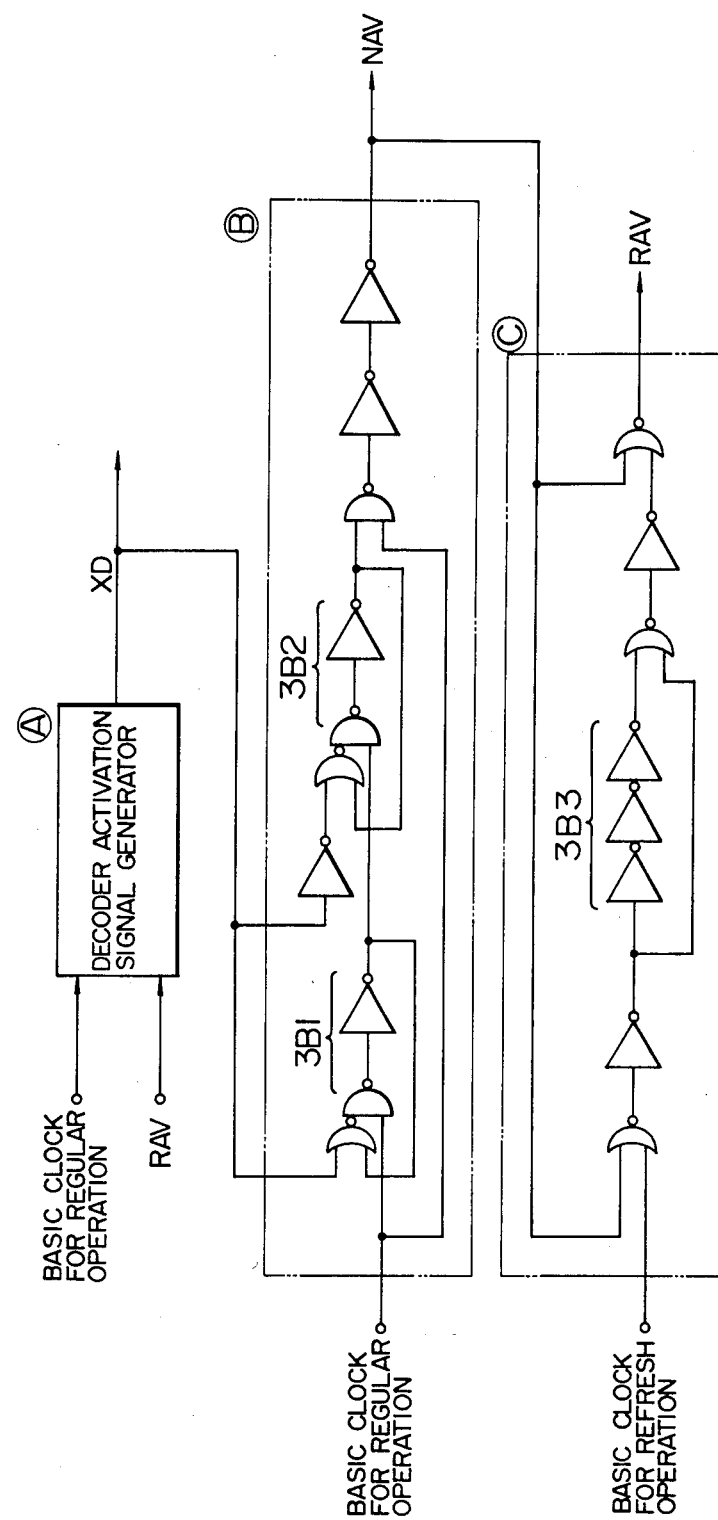
FIG. 3B is a circuit diagram showing an example of the control circuit of FIG. 3A.

FIG. 3B shows an example of the control circuit 18. Referring to FIG. 3B, the above example includes a logic group Ⓐ applied with the refresh address activation signal RAV and the basic clock for regular operation, for generating the decoder activation signal (namely, the word line selection signal) XD, a logic group Ⓑ applied with the basic clock for regular operation and the decoder activation signal XD, for generating the regular address activation signal NAV, and a logic group Ⓒ for generating the refresh address activation signal RAV in a refresh operation and for generating the regular address activation signal NAV in preference to the refresh address activation signal RAV when the regular operation and the refresh operation for the same memory cell occur at the same time, that is, generating the regular address activation signal NAV in the course of the refresh operation and generating the refresh address activation signal RAV once more after the completion of the regular operation. The leading and falling edges of each of the signals XD, NAV and RAV and a delay time between two of these signals can take desired values by selecting dimensions (namely, the channel length, the channel width and others) of each of MOS transistors making up the logic group Ⓐ, Ⓑ and Ⓒ in accordance with an optimum design. Further, in order to appropriately determine the pulse width of each of the above signals, the logic group Ⓐ includes a delay circuit (not shown), and the logic groups Ⓑ and Ⓒ include delay circuits 3B1 and 3B2 and a delay circuit 3B3, respectively.

Referring back to FIG. 3A, the output of the regular address buffer 22 and the output of the refresh address buffer 13 are both sent to the row decoder 14. That is, two kinds of address signals can be sent to the row decoder 14. The change-over of address signals of one kind to address signals of another kind is made by the regular address activation signal NAV and the refresh address activation signal RAV, and thus address signals of one or the other kind are applied to the row decoder 14. Further, the row decoder 14 is activated by the decoder activation signal XD, and thus a predetermined word line can be selected. By using the above-mentioned control method, the present embodiment can perform both the regular operation of the conventional asynchronous static RAM and a refresh operation, and a large asynchronous RAM can be realized which is so small in power consumption as to make it possible to make the battery back-up for the RAM.

Figure 4:
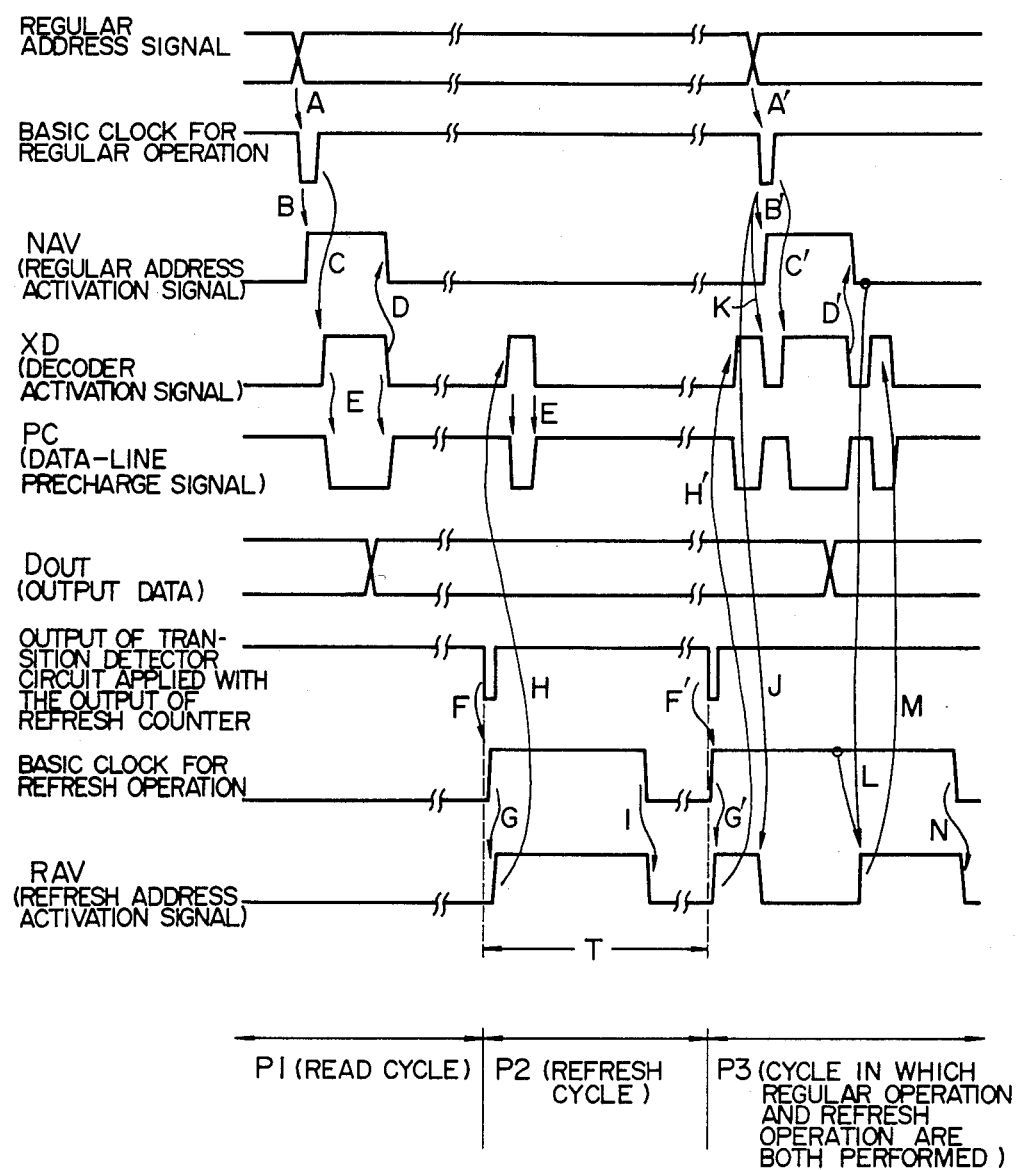
FIG. 4 is a timing chart for explaining the operation of the embodiment of FIG. 3A.

FIG. 4 is a timing chart for explaining the operation of the present embodiment. In more detail, FIG. 4 shows the waveforms of various control signals and the relationship therebetween, in each of a read (or write) cycle P1, a refresh cycle P2 and a cycle P3 in which the regular operation and the refresh operation for the same memory cell occur at the same time.

The read operation will first be explained below. When the logical level of one of the regular address signals is changed to specify a new address, the above logical change is detected by the regular transition detector circuit 23, and the basic clock for regular operation is generated by the regular clock generator 24, as indicated by reference character A in FIG. 4. The regular address activation signal NAV is generated on the basis of the above basic clock, as indicated by reference character B in FIG. 4. Thus, the regular address signals are applied to the row decoder through the regular address buffer. When the basic clock for regular operation is put from a low level to a high level, the decoder activation signal XD is generated as indicated by reference character C in FIG. 4, to activate the row decoder 14, thereby selecting a predetermined word line. At this time, the column decoder (shown in FIG. 10) has been activated, and a predetermined data line pair has been selected by the column selector (shown in FIG. 10). Accordingly, data stored in a predetermined memory cell appears on the data line pair, and is sent to a data output terminal through a common data line and an output circuit, in the form of a logical value "1" or "0". When a delay time determined by the delay circuit which is included in the logical group Ⓐ of FIG. 3B, has elapsed, the decoder activation signal XD is put from a high level to a low level, and thus no word line is selected. The regular address activation signal NAV takes a low level at the same time as the decoder activation signal takes the low level, as indicated by reference character D in FIG. 4, to stop an operation for selecting the predetermined word line. While, a precharge signal PC for controlling load MOS transistors connected to the data line pair is controlled by the decoder activation signal XD, as indicated by reference character E in FIG. 4. In a period when the word line is selected, the load MOS transistors are made non-conductive, to intercept a current flowing into a MOS transistor of the predetermined memory cell. When the word line is made non-selective, the load MOS transistors are made conductive to precharge the data line pair at high speed. The data appearing on the data line pair is latched by the output circuit, before the signal XD takes the low level thereby making the row decoder inactive. The above data is held by the data output terminal, until the level of one of the regular address signals is changed.

Next, explanation will be made of a refresh operation which is performed for a predetermined memory cell when a read operation for the memory cell, that is, the operation that the regular address signals specifying the memory cell are applied to the row decoder and data in the memory cell is fetched to the data output terminal, has been completed. When the level of the refresh address signal 15 generated independently of the regular address signals and having the highest frequency is changed, the basic clock for refresh operation is generated on the basis of the output signal of the transition detector circuit 16, as indicated by reference character F in FIG. 4. The refresh address activation signal RAV is generated on the basis of the basic clock for refresh operation, as indicated by reference character G in FIG. 4, and thus the refresh address signals corresponding to the output signals of the refresh counter 12 are sent to the row decoder 14. Then, the decoder activation signal XD is generated as indicated by reference character H in FIG. 4, to select a word line which is connected to a memory cell to be refreshed. Thus, memory cells connected to the selected word line can be simultaneously refreshed. The pulse width of the decoder activation signal is selected so that the voltage of the high-potential node of each memory cell is increased to a sufficiently high level by a current supplied from a data line. The above pulse width is determined by the delay circuit included in the logical group Ⓐ of FIG. 3B. In the regular operation, for example, the read operation, the decoder activation signal XD takes the low level after data has been outputted from a memory cell, and hence the signal XD is required to have a large pulse width corresponding to an access time. While, in the refresh operation, the pulse width of the signal XD may be made equal to a minimum time necessary for refreshing the data of a memory cell. This reduces the power consumption of the present embodiment, and thus makes it possible to make the battery back-up for the embodiment. In the refresh operation, the column decoder is put into a non-selective state. When a predetermined delay time has elapsed after the basic clock for refresh operation was generated, this basic clock and the refresh address activation signal RAV are simultaneously put to a low level, to stop an operation for sending the refresh address signals to the row decoder. Thus, the refresh operation for the predetermined memory cell is completed. When the level of the refresh address signal 15 having the highest frequency is again changed to perform the refresh operation for another memory cell, the same processing as mentioned above is carried out.

Next, explanation will be made of a case where the read (or write) operation and the refresh operation for the same memory cell occur at the same time. The present embodiment is an asynchronous memory, and is required to perform a read or write operation on the basis of the regular address signals even when the refresh operation is automatically performed. In the present embodiment, the read or write operation based upon the regular address signals is performed in preference to the refresh operation. Referring to the cycle P3 of FIG. 4, the refresh operation for a predetermined memory cell is started, as indicated by reference characters F', G' and H'. When the logical level of one of the regular address signals is changed in the course of the refresh operation, the above change is detected, and the basic clock for regular operation is generated as indicated by reference character A'. This basic clock activates the regular address activation signal as indicated by reference character B', causes the refresh address activation signal RAV to take the low level as indicated by reference character J, and puts the decoder activation signal XD to the low level as indicated by reference character K. Thus, the selection of refresh address and the refresh operation are stopped. Then, the basic clock for regular operation takes the high level, thereby activating the decoder activation signal XD as indicated by reference character C'. Thus, the read or write operation is performed for a memory cell corresponding to the logical levels of the regular address signals. In a case where the basic clock for refresh operation is kept at the high level when a series of operations mentioned above has been completed as indicated by reference character D', a refresh operation indicated by reference characters L and M is performed for the memory cell which has been already subjected to the refresh operation indicated by reference characters F', G' and H'. This is because the refresh operation indicated by the reference characters F', G' and H' was insufficient and the decoder activation signal was put to the low level in the course of the above refresh operation. Accordingly, it is necessary to perform a complete refresh operation after a series of operations based upon the regular address signals has been completed. In view of the above fact, the pulse width of the basic clock for refresh operation is required to be equal to or greater than the sum of the pulse width of the decoder activation signal XD used in the regular operation and twice the pulse width of the decoder activation signal XD used in the refresh operation. Further, in a case where the basic clock for refresh operation is generated in a period when the regular address activation signal NAV is kept at the high level, that is, a read or write operation is performed, the refresh address activation signal RAV cannot take the high level, and hence a refresh operation is performed after the read or write operation has been completed.

As has been explained in the foregoing, the characteristic features of the present invention reside in that a volatile memory cell is used which does not include current supplying means for retaining data statically, that the semiconductor chip of a memory is provided with automatic refresh means including a timer, a refresh counter and a refresh address buffer for detecting a logical change in output signals of the refresh counter to perform a refresh operation on the basis of a basic clock resulting from the above logical change, that a read or write operation is performed on the basis of another basic clock resulting from a logical change in regular address signals, asynchronously with a periodic refresh operation, and that a read or write operation based upon the regular address signals is performed in preference to a refresh operation in a period when the refresh operation is being performed, and the refresh operation is again performed after the read or write operation has been completed. Even when the present embodiment is put into a non-selective state (that is, an ordinary stand-by state) by a chip select signal, a refresh operation is automatically performed, and hence the data of each memory cell is not damaged. Further, the automatic refresh method according to the present invention reduces power consumption and makes it possible to retain data for a long time by using a battery. The power consumption at a period when the embodiment is kept at a stand-by state or a state that the data of a memory cell is ratained by a battery, is divided mainly into the power necessary for driving the electric capacity of word lines, the power necessary for precharging the electric capacity of data lines, and the power necessary for driving the output capacity of the refresh counter. It is to be noted that the above discussion has been made for a case where the present embodiment is made up of complementary MOS transistors. Each power is basically expressed by an equation $P = C \cdot V^2 \cdot f$, where C indicates an electric capacity, V a voltage, and f a frequency. That is, the power P decreases as the electric capacity, the voltage amplitude and the frequency are smaller. Now, let us consider how memory cells are to be arranged in a memory cell array. The power necessary for driving the electric capacity of the word lines is small when the number of memory cells connected to one word line is larger than the number of memory cells connected to a pair of data lines, for the following reason. Memory cells connected to one word line are simultaneously refreshed, and all memory cells included in the memory cell array are refreshed in a predetermined period T. Accordingly, the power consumption due to the word lines decreases as the number of word lines is smaller. The electric capacity of the data line decreases as the number of memory cells connected to the data line is smaller. The power consumption also decreases when a time during which memory cells are selected for a refresh operation is shorter and when a potential drop $\Delta V$ which is generated on a data line in a refresh operation is smaller. Further, the power necessary for the refresh counter is used mainly for driving the electric capacity of the output lines of the refresh counter. Therefore, the above power decreases as the number of output bits of the refresh counter, that is, the number of refresh address signals is smaller. Accordingly, in a case where one word line is divided into a plurality of address lines in a regular operation, to reduce the number of memory cells to be selected at the same time, thereby reducing the power consumption in the regular operation, it is necessary to make the number of address lines per word line as small as possible in a refresh operation, thereby reducing the power consumption in the refresh operation.

Figure 5:
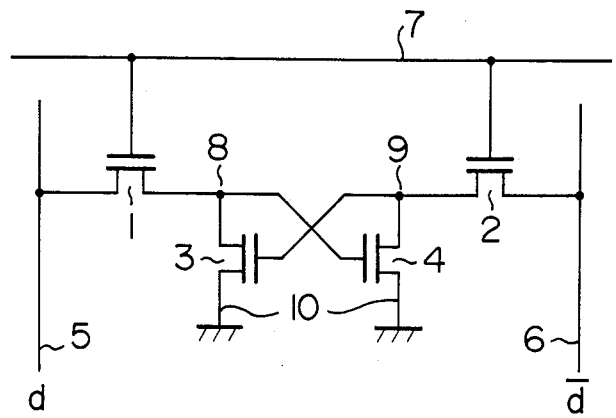
FIG. 5 is a circuit diagram showing an example of a memory cell used in a semiconductor memory according to the present invention.

Basically, any volatile memory cell can be used in a semiconductor memory according to the present invention. Specifically, a 4 MOS transistor memory cell which is made up of four n-channel MOS transistors and has a structure shown in FIG. 5, is suitable for use in the semiconductor memory. This memory cell is formed on a p-type substrate, or in a p-type well provided on an n-type substrate. Further, a 4 MOS transistor memory cell which uses a p-channel MOS transistor as the transfer transistor and uses an n-channel MOS transistor as the driver transistor, can also be used in a semiconductor memory according to the present invention. In this case, when a word line connected to a desired memory cell is put to a low potential level, the memory cell is refreshed.

The automatic refresh circuit of FIG. 1 and the embodiment of FIG. 3 are preferably made up of complementary MOS transistors, to reduce the power consumption of the automatic refresh circuit and the embodiment.

Now, the refresh operation for a 4 MOS transistor memory cell will be explained below, by way of example.

Figure 6:
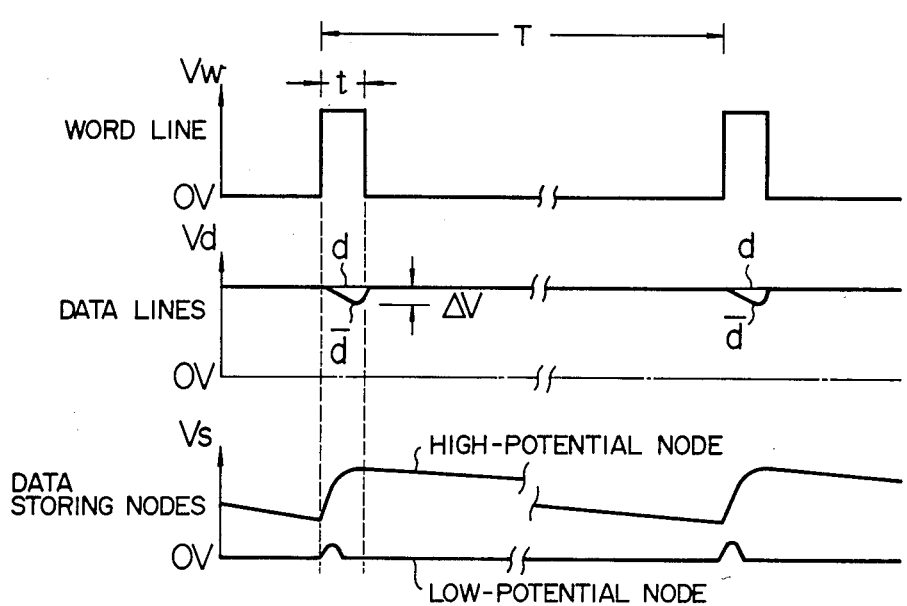
FIG. 6 is a timing chart for explaining the refresh operation for the memory cell of FIG. 5.

FIG. 6 is a timing chart for explaining the refresh operation for a memory cell which includes four n-channel MOS transistors and has the structure shown in FIG. 5, and shows the variation of voltage with time at a word line 6, a pair of data lines 5 and 6, and data storing nodes 8 and 9. First, the word line 7 is put from a low potential level to a high potential level, to select all memory cells connected to the word line 7. At this time, data stored in the memory cell causes a small potential difference $\Delta V$ between the data lines 5 and 6 which have been precharged to a high potential level. In more detail, when the word line 7 is put to the high potential level, the potential $\bar{d}$ of the data line 6 which is connected to the low-potential node 9 through a transfer MOS transistor 2, begins to drop, but the potential d of the data line 5 which is connected to the high-potential node 9 through a transfer MOS transistor 1, is kept at substantially the same high potential level as obtained by the precharge operation. This is because the parasitic capacity $C_D$ of the data line 5 is far greater than the parasitic capacity $C_S$ of the node 8. Usually, the parasitic capacity $C_D$ is greater than 1PF, and the parasitic capacity $C_D$ is equal to or less than 20 fF. Accordingly, even when the potential of the highpotential node 8 is decreased by a leak current at a connecting point, electric charge corresponding to the potential drop is supplied from the data line 5 to the node 8, and moreover the potential d of the data line 5 is kept at substantially the same level as obtained by the precharge operation. By the above operation, data is again written in the memory cell, that is, data stored in the memory cell is refreshed. When a time has elapsed, the refreshed data is extinguished by the leak current and others. Accordingly, a predetermined row including the above memory cell is selected at an interval T, and the refresh operation is performed for memory cells included in the row.

Next, it will be explained that a time t during which the word line 7 takes the high potential level to perform a refresh operation, is made as short as possible, and the potential difference $\Delta V$ between the data lines 5 and 6 in the refresh operation is made small. The time t is preferably made equal to a period necessary for increasing the potential of the high-potential node 8 to a sufficiently high level by electric charge which is supplied from the data line 5 through the transfer MOS transistor 1, and is usually set to 20 $\mu$s or less. While, the potential difference $\Delta V$ has an immediate connection with the power consumption of the memory cell. In more detail, after the time t has elapsed, the word line 7 takes a low potential level, and thus the predetermined memory cell is not selected nor refreshed. Then, the data line 6 is precharged through a load transistor (not shown) connected thereto so that the data lines 5 and 6 have the same high potential. The power necessary for the precharge operation is proportional to the square of the potential difference $\Delta V$, and hence the power consumption decreases as the potential difference $\Delta V$ is smaller.

Figure 7:
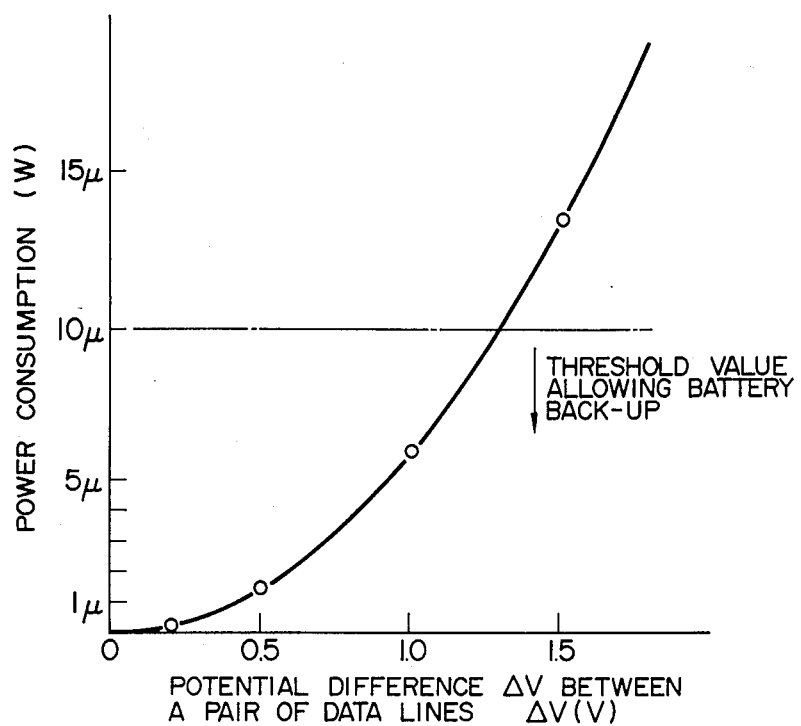
FIG. 7 is a graph showing a relationship between the potential difference between a pair of data lines and the power consumption.
Figure 9:
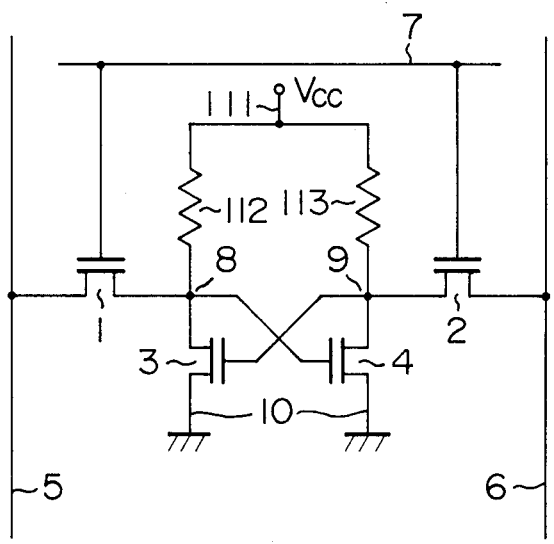
FIG. 9 is a circuit diagram showing a conventional memory cell.

FIG. 7 shows a relationship between the potential difference $\Delta V$ and the power consumption of data lines in a refresh cycle, for a case where 256 memory cells are connected to a pair of data lines and the refresh operation for a memory cell is performed at an interval of 100 ms. Usually, the power consumption making possible the battery back-up is about 10 $\mu$W for a case where a supply voltage of 5 V is used and the memory is used at room temperature. Accordingly, the potential difference $\Delta V$ is made less than 1 V, taking various margins into consideration.

Further, it is desirable that load transistors connected to the data lines are kept at a non-conductive state for a period when a word line takes a high potential level to select a desired memory cell. In more detail, in a memory cell including four n-channel MOS transistors and having the structure shown in FIG. 5, a current flows from the data line 6 to the low-potential node 9 at a time the word line 7 takes the high potential level. At this time, if the load transistor connected to the data line 6 is put into a conductive state, a DC current flows from a power source into the memory cell, and thus power consumption will increase. In other words, if the above load transistor is kept at the non-conductive state for the period when the word line 7 is put to the high potential level, no current will flow through a power supply terminal in this period, and thus only a current necessary for precharging the data line 6 after the word line 7 has been put to the low potential level, will be supplied from the power source.

Figure 8A:
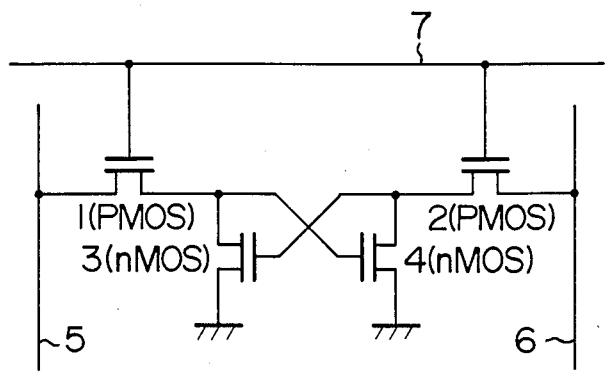
FIG. 8A is a circuit diagram showing another example of a memory cell used in a semiconductor memory according to the present invention.
Figure 8B:
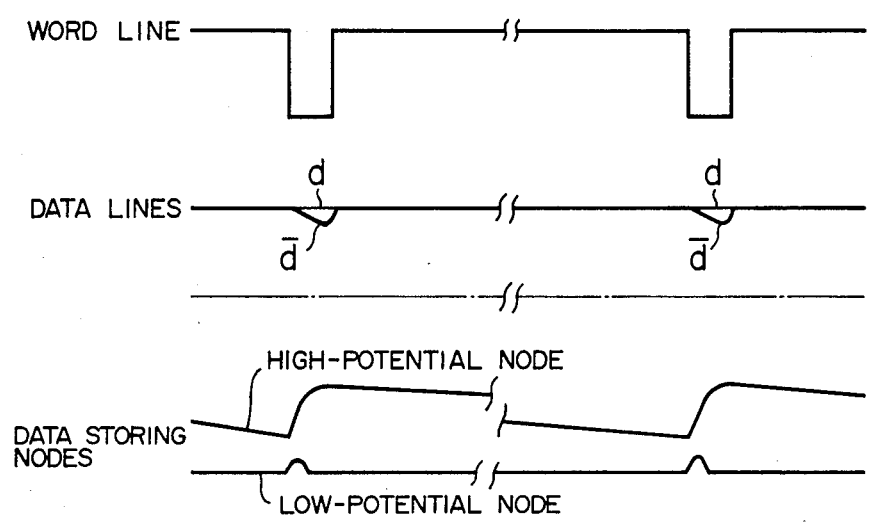
FIG. 8B is a timing chart for explaining the refresh operation for the memory cell of FIG. 8A.

FIG. 8A shows another example of a memory cell which can be used in a semiconductor memory according to the present invention. Referring to FIG. 8A, p-channel MOS transistors are used as the transfer transistors 1 and 2, and n-channel MOS transistors are used as the driver transistors 3 and 4. FIG. 8B is a timing chart for explaining the refresh operation for the memory cell of FIG. 8A. As shown in FIG. 8B, when the word line 7 takes a low potential level, the memory cell is selected and refreshed.

In the foregoing explanation, two kinds of 4 MOS transistor memory cells have been shown, by way of example. It is needless to say that the present invention is applicable to a semiconductor memory which includes memory cells each different from the above 4 MOS transistor memory cells.

Figure 11:
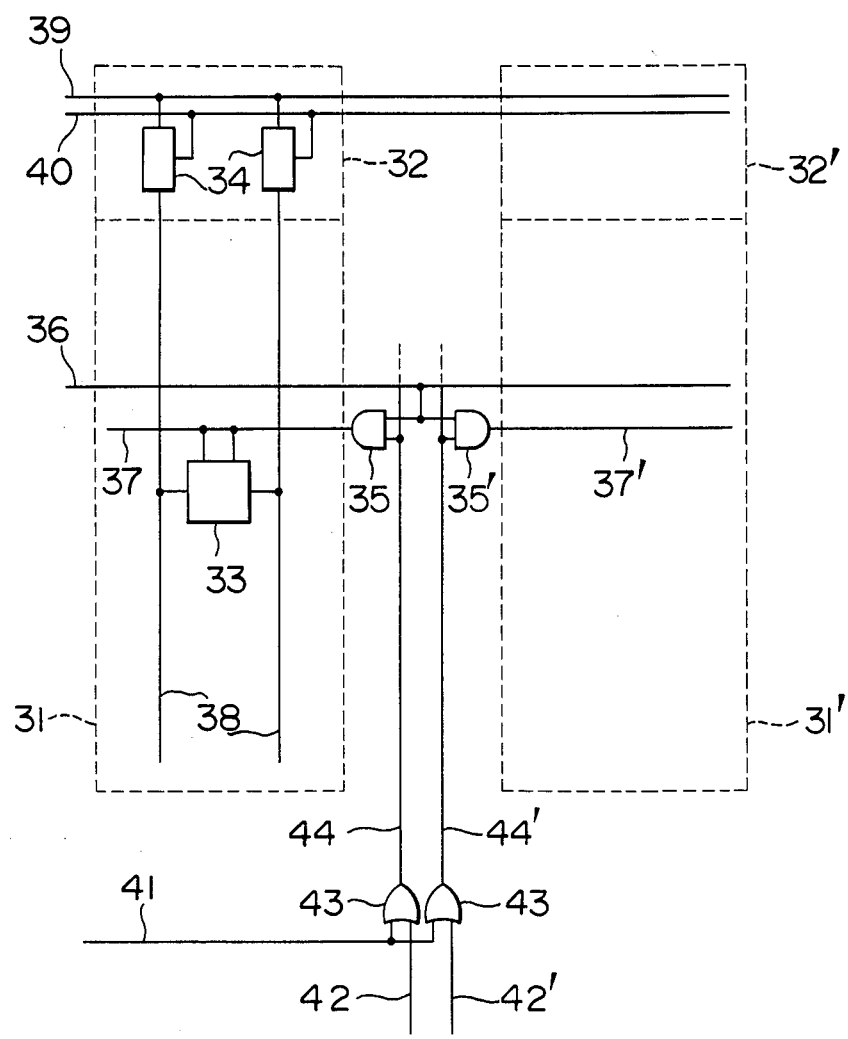
FIG. 11 is a circuit diagram showing a memory cell array of another embodiment of a semiconductor memory according to the present invention.
Figure 12:
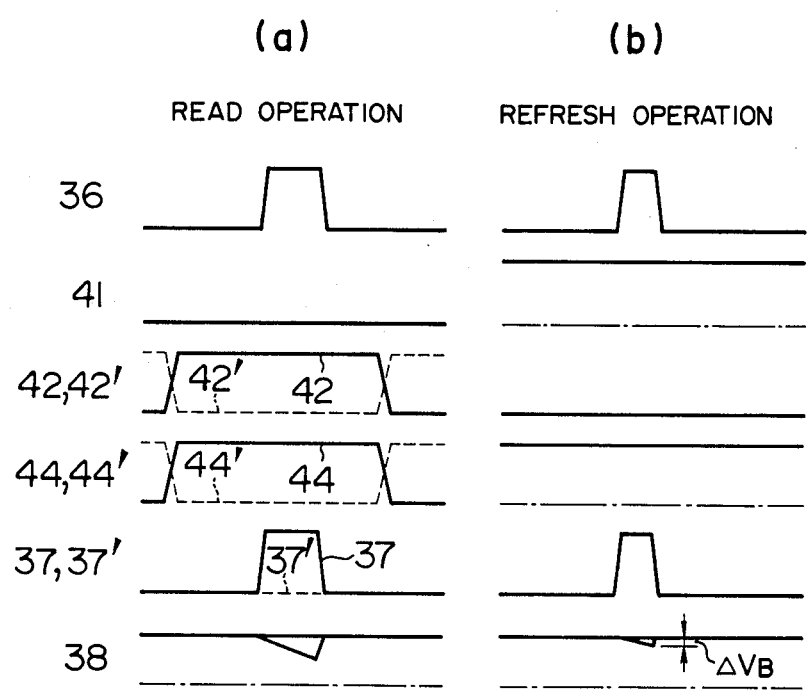
FIG. 12 parts (a) and (b), is a waveform chart for explaining the operation of the circuit of FIG. 11.

FIG. 11 is a circuit diagram showing a memory cell array of another embodiment of a semiconductor memory according to the present invention which array includes volatile memory cells having a self-amplifying function, and FIG. 12 is a waveform chart for explaining the operation of the circuit of FIG. 11. In more detail, part (a) of FIG. 12 shows a case where a read operation is performed, and part (b) of FIG. 12 shows a case where a refresh operation is performed.

In FIGS. 11 and 12, reference numerals 31 and 31' designate memory cell arrays, 32 and 32' bit line current supply means arrays, 33 a memory cell, 34 bit line current supply means, 35 and 35' word line dividing means, 36 a main word line, 37 and 37' divided word lines, 38 bit lines, 39 a power supply line, 40 a bit-line-current-supply-means driving signal line, 41 a refresh control signal line, 42 and 42' signal lines from the row decoder, 43 and 43' word line division control means according to the present invention, and 44 and 44' word line division control signal lines. The main word line 36 and the signal lines 42 and 42' are driven by outputs of the row decoder/word driver 14 of FIG. 3A, and the refresh control signal line 41 is driven by an output of the control circuit 18.

Similarly to the embodiment of FIG. 3A, the operation of the present embodiment is started when address signals to a chip are changed or a refresh control signal in the chip is generated. At first, all the bit lines 8 in the memory cell arrays 31 and 31' are precharged by the bit line current supply means 34. In a case where information is read out of or written in a memory cell, the refresh control signal line 41 is not activated, but a signal on the signal line 42 or 42' is applied to the word line dividing means 35 or 35' through the word line division control means 43 or 43' and the word line division control signal line 44 or 44'. Then, a specified main word line (for example, the main word line 36) is selected and activated, and thus one of the divided word lines 37 and 37' is activated. (Part (a) of FIG. 12 shows a case where the divided word line 37 is activated). Then, information is read out of or written in the memory cell 33 through the bit line 38.

In a case where a refresh operation is performed, the refresh control signal line 41 is activated, and thus the word line division control signal lines 44 and 44' are both activated by the word line division control means 43 and 43', independently of the states of the signal lines 42 and 42'. Accordingly, when the main word line 36 is activated, the divided word lines 37 and 37' are both activated. At this time, the bit lines 38 are not selected, but electric charges which are previously stored on the bit lines 38 by the pre-charge operation, flow into the memory cell 33. Thus, information stored in the memory cell 33 is refreshed with the aid of the self-amplifying function thereof. In this case, a time required for refreshing the stored information is very short, since (the memory cell has a function of self-amplifying the output thereof. Accordingly, the potential difference $\Delta V_B$ between a pair of bit lines 38 can be made less than 0.5 V. Thus, the present embodiment has the following advantages. That is, in a read or write operation, only one of the divided word lines 37 and 37' (that is, the necessary and minimum word line) is activated. Accordingly, an access time required for the read or write operation can be made very short, and power consumption can be reduced. While, in a refresh operation, a large number of memory cells belonging to one main word line are simultaneously refreshed, and hence it is possible to make the cycle time (namely, repetition period) of the refresh operation one hundred or more times longer than the cycle time of the read or write operation in a chip selection state. Accordingly, power consumption in a chip non-selection state for performing a refresh operation can be made very small. That is, a semiconductor memory can be realized which is so small in power consumption as to make possible the battery back-up for the semiconductor memory.

Figure 13:
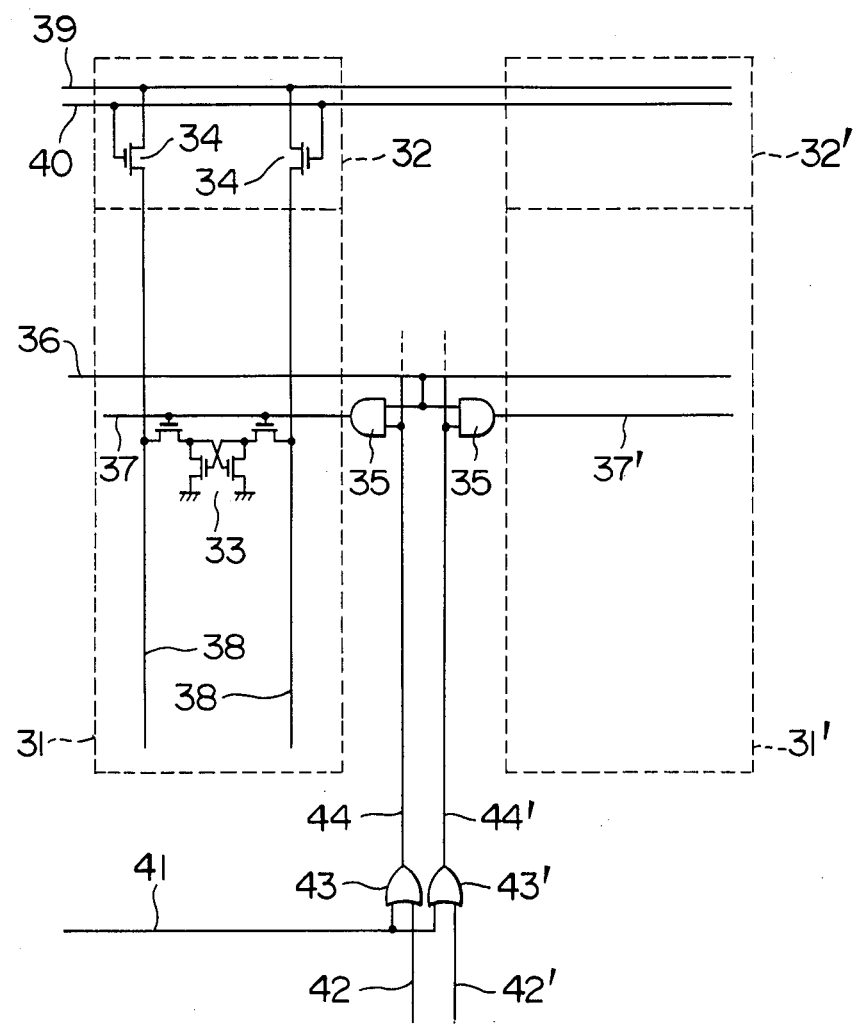
FIG. 13 is a circuit diagram showing an actual circuit configuration of the memory cell array of FIG. 11.

FIG. 13 is a circuit diagram showing an actual circuit configuration of the memory cell array of FIG. 11. In the present circuit configuration, an insulated gate field effect transistor (hereinafter referred to as "MOS FET") is used as the bit line current supply means 34, and the memory cell 33 is made up of four MOS FET's.

Figure 14:
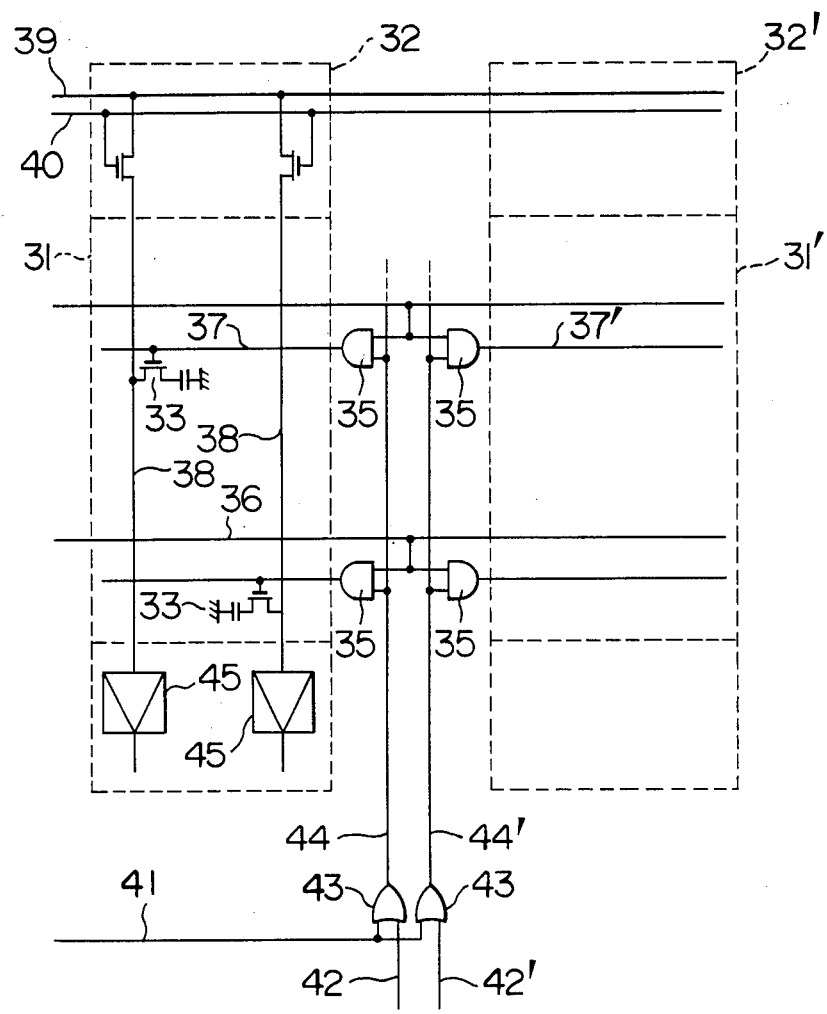
FIG. 14 is a circuit diagram showing a modified version of the memory cell array of FIG. 11.

FIG. 14 is a circuit diagram showing a modified version of the memory cell array of FIG. 11. In the modified array, a dynamic type memory element made up of one MOS FET and one capacitor is used as the memory cell 33. In this case, the memory cell does not have the self-amplifying function, and a read operation is performed destructively. Accordingly, each bit line 38 is provided with a column sense amplifier 45.

Roughly speaking, any volatile memory cell can be used in a semiconductor memory according to the present invention. Specifically, a 4-element memory cell such as shown in FIG. 13, that is, a memory cell made up of four MOS FET's is an optimum cell for the present embodiment. In a case which each MOS FET is an N-channel MOS FET, the memory cell is formed on a P-type substrate or a P-type well provided on an N-type substrate. Alternatively, the memory cell may be made up of a pair of P-channel MOS FET's serving as transfer transistors and a pair of N-channel MOS FET's serving as driver transistors. In this case, when a word line connected to the memory cell is put to a low potential level, the memory cell is selected and can be refreshed.

In the circuit configurations of FIGS. 11, 13 and 14, two divided word lines 37 and 37' belong to the main word line 36, and only one of the divided word lines 37 and 37' is activated in a read or write operation. In order to reduce the power consumption in a read or write operation and to perform the read or write operation at high speed, it is necessary that three or more divided word lines are provided for a main word line. It is needless to say that, in the circuit configurations of FIGS. 11, 13 and 14, a large number of divided word lines can be provided for one main word line 36.

Figure 15:
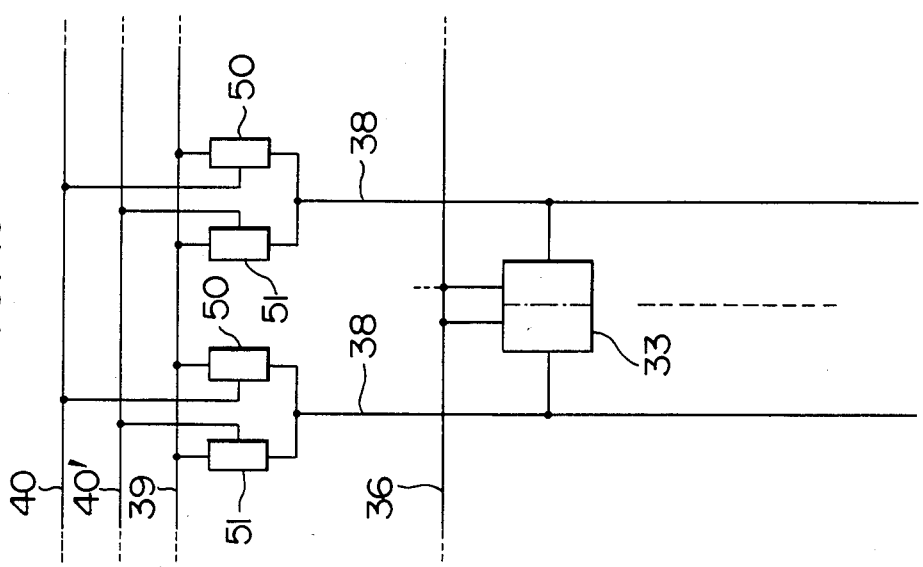
FIG. 15 is a circuit diagram showing a memory cell array of a further embodiment of a semiconductor memory according to the present invention.

FIG. 15 is a circuit diagram showing a memory cell array of a further embodiment of a semiconductor memory according to the present invention. In FIG. 15, reference numeral 33 designates a memory cell, 50 bit line current supply means activated by a driving signal line 40 during a chip selection period (that is, during a read or write operation) to supply a current from a power supply line 39 to a bit line 38, 51 bit line current supply means activated by another driving signal line 40' during a chip non-selection period (that is, during a refresh operation) to supply a current from the power supply line 39 to the bit line 38, and 36 a word line. An access to the memory cell 33 in a chip selection state is started by activating the bit line current supply means 50 having a large driving capability by the driving signal line 40, so that the bit lines 38 are pre-charged at high speed. Thereafter, predetermined bit and word lines are selected on the basis of decoded signals, and then information is written in or read out of a predetermined memory cell through the bit line. In this case, in order to shorten the cycle time of the access to memory cell, a time necessary for pre-charging the bit line is made as short as possible. That is, it is required to make large the driving capability of the bit line current supply means 50. While, in a chip non-selection state, a refresh operation is performed to prevent information stored in a volatile memory cell from being damaged. The refresh operation is performed in the following manner. The bit line current supply means 51 is first activated by the driving signal line 40' to pre-charge the bit lines 38. Thereafter, a predetermined word line is selected to specify memory cells, and then information data in each of the specified memory cells is self-amplified or amplified by a column senser amplifier or others, to be rewritten in the memory cell. Unlike the chip selection state, the cycle time of the refresh operation can be made very long, provided that the information data in each memory cell is not damaged (or destroyed). For example, it is possible to make the cycle time of the refresh operation one hundred or more times longer than the cycle time of the access in the chip selection state (namely, the cycle time of the read or write operation). Accordingly, in the refresh operation, a time necessary for pre-charging bit lines can also be made long, that is, the driving capability of the bit line current supply means 51 can be made low to reduce power consumption. Thus, the parasitic capacitance of the bit-line-current-supply-means driving signal line 40' can be greatly reduced and electric power required for driving the bit line current supply means can be reduced, as will be explained later. According to the present embodiment, the electric power necessary for driving the bit line current supply means 51 in the chip non-selection state can be less than one hundredth of the electric power in a case where the present embodiment is not used. That is, power consumption in the chip non-selection state can be made extremely small. Thus, a semiconductor memory can be realized which is so small in power consumption as to allow battery backup.

Figure 16:
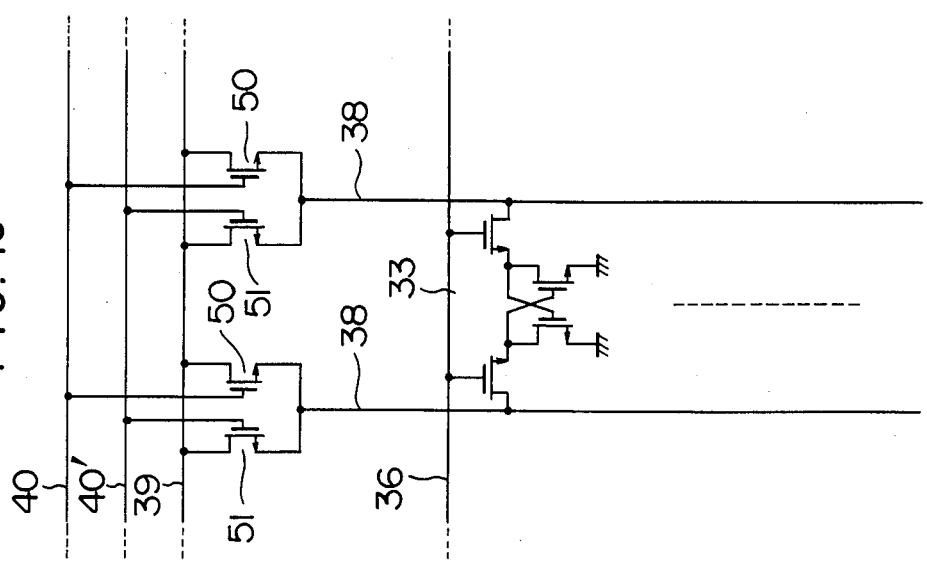
FIG. 16 is a circuit diagram showing an actual circuit configuration of the memory cell array of FIG. 15.

FIG. 16 is a circuit diagram showing an actual circuit configuration of the memory cell array of FIG. 15. In the circuit configuration of FIG. 16, each of the bit line current supply means 50 and 51 is formed of an N-channel MOS FET, and the memory cell 33 is made up of four N-channel MOS FET's. In the N-channel MOS FET serving as the bit line current supply means 50, a ratio of the channel width W to the channel length L (namely, a ratio W/L) is made large to decrease the ON-resistance $R_{ON}$ of the MOS FET, thereby increasing the driving capability (that is, current supplying capability) of the MOS FET.

While, in the N-channel MOS FET serving as the bit line current supply means 51, a ratio of the channel width W to the channel length L is made small, to increase the ON-resistance $R_{ON}$ of the MOS FET, thereby reducing the driving capability thereof. Hence, the gate capacitance of the N-channel MOS FET serving as the bit line current supply means 51 is small, and thus the parasitic capacitance of the bit-line-current-supply-means driving signal line 40' is also small. Thus, electric power necessary for driving the signal line 40' can be reduced.

Figure 17:
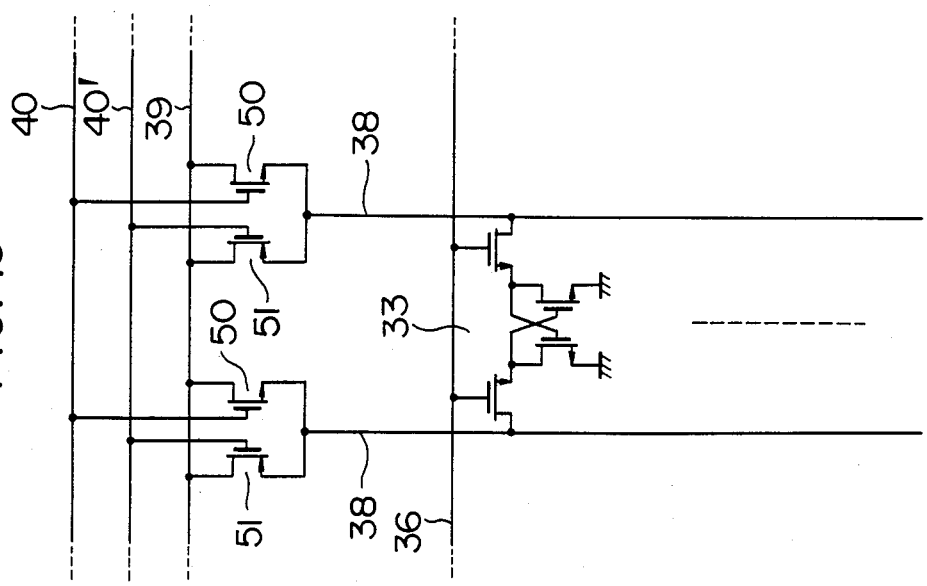
FIG. 17, parts (a) and (b) is a waveform chart for explaining the operation of the circuit of FIG. 16.

FIG. 17 is a waveform chart for explaining the operation of the circuit of FIG. 16. In FIG. 17, part (a) shows a case where a read operation is performed, and part (b) shows a case where a refresh operation is performed.

When an access to the memory cell 33 in a chip selection state (that is, in a read or write operation) is started by an external signal or others, the bit-line-current-supply-means driving signal line 40 takes a high potential level, independently of the present potential level thereof. Thus, the bit line current supply means 50 is activated, and the bit line 38 is pre-charged at high speed. However, the driving signal line 40 is put to a low potential level during a period when the word line 36 is selected, to make the bit line current supply means 50 inactive. Thus, information is read out from the memory cell 33 to the outside through the bit line 38 at the above period. When the read operation is completed, the driving signal line 40 is again put to the high potential level, and thus the bit line is pre-charged at high speed to prepare the next access. In this case, the driving signal lines 40' is kept at the low potential level, and the bit line current supply means 51 is not activated. While, in a chip nonselection state (that is, in a refresh operation), the driving signal line 40 is kept at the low potential level to keep the bit line current supply means 50 inactive, and information in the memory cell 33 is refreshed with the aid of the driving signal line 40' and the bit line current supply means 51. The cycle time (namely, repetition period) of the refresh operation is made far longer than that of the read or write operation. Accordingly, after information in the memory cell having the self-amplifying function has been refreshed at high speed, the bit line 38 can be pre-charged at low speed by the bit line current supply means 51 having a low driving capability. Thus, electric power necessary for driving the bit line current supply means can be reduced.

Figure 18:
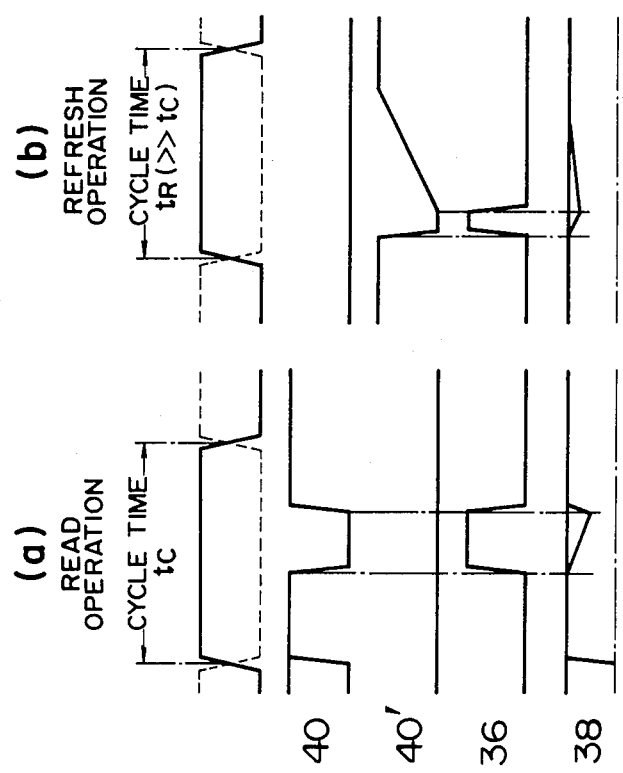
FIG. 18 is a circuit diagram showing another actual circuit configuration of the memory cell array of FIG. 15.

FIG. 18 is a circuit diagram showing another actual circuit configuration of the memory cell array of FIG. 15. In this circuit configuration, the bit line current supply means 50 is formed of an N-channel MOS FET, and the bit line current supply means 51 is formed of a P-channel MOS FET. FIG. 19 is a waveform chart showing the operation of the circuit of FIG. 18. Unlike the circuit configuration of FIG. 16, a refresh operation is performed by putting the driving signal line 40' from the low potential level to the high potential level.

As has been already mentioned, any volatile memory cell can be used in a semiconductor memory according to the present invention. Specifically, a 4-element memory cell such as shown in FIG. 18 (that is, a memory cell made up of four N-channel MOS FET) is an optimum cell for the present embodiment. The memory cell including four N-channel MOS FET is formed on a P-type substrate or a P-type well provided on an N-type substrate. Alternatively, the memory cell may be made up of a pair of P-channel MOS FET's serving as transfer transistors and a pair of N-channel MOS FET's serving as driver transistors. In this case, when a word line connected to the memory cell is put to a low potential level, the memory cell is selected and refreshed.

Figure 20:
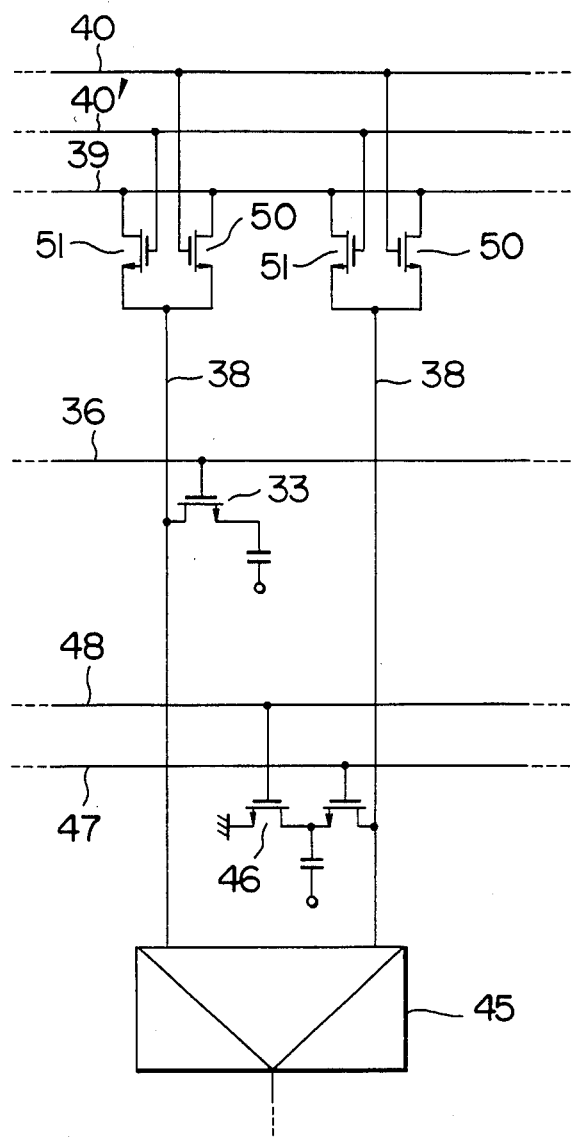
FIG. 20 is a circuit diagram showing a modified version of the memory-cell array of FIG. 15.

FIG. 20 is a circuit diagram showing a modified version of the memory cell array of FIG. 15. In the modified array, a dynamic type memory element made up of one MOS FET and one capacitor is used as the memory cell 33. FIG. 21 is a waveform chart showing the operation of the circuit of FIG. 20. In FIG. 21, part (a) shows a case where a read operation is performed, and part (b) shows a case where a refresh operation is performed. In the present array, the memory cell does not have the self-amplifying function, and a read operation is performed destructively. Accordingly, a read operation and a refresh operation are performed by using a dummy cell 46 and a column sense amplifier 45. However, the bit line 38 is driven in the same manner as in the circuit configurations of FIGS. 15, 16 and 18. Accordingly, in the modified array of FIG. 20, also, power consumption in the refresh operation can be made very small.

We claim:

1. A semiconductor memory comprising:
a memory cell array including a plurality of memory cells, said memory cells being arranged in the form of a matrix;
decoding means for selecting a desired one of said memory cells; and
automatic refresh means including a timer, a refresh counter for generating a plurality of pulse signals which are different in frequency from each other and are used as refresh address signals, on the basis of the output of said timer, a refresh address buffer for converting each of said refresh address signals into positive and negative signals, a transition detector circuit for detecting a logical change in a refresh address formed of said refresh address signals, a refresh clock generator for generating a basic clock signal for a refresh operation, on the basis of the output of said transition detector circuit, and a control circuit which delivers a decoder activation signal for controllably activating said decoding means and a refresh address activation signal for controlling the transmission of said refresh address from said refresh address buffer to said decoding means, on the basis of said basic clock signal for refresh operation, each formed on a semiconductor chip mounted with said memory cell array, for automatically performing a periodic refresh operation on the basis of said basic clock signal, said automatic refresh means being provided with means for performing one of a read operation and a write operation each based upon a regular address signal asynchronous with the periodic refresh operation, in preference to the periodic refresh operation.

2. A semiconductor memory comprising:
a memory cell array including a plurality of memory cells, said memory cells being arranged in the form of a matrix;
decoding means for selecting a desired one of said memory cells;
data inputting/outputting means;
means for generating an address for refresh operation; and
automatic refresh means for automatically performing a refresh operation for a memory cell in accordance with said address for refresh operation, in a period other than a period when one of a read operation for reading out data from said memory cell and a write operation for writing data in said memory cell is performed,
wherein said means for generating an address for refresh operation includes a timer and a refresh counter for generating a plurality of pulse signals which are different in frequency from each other and are used as refresh address signals, on the basis of the output of said timer, and wherein said automatic refresh means includes a refresh address buffer for converting each of said refresh address signals into positive and negative signals, a transition detector circuit for detecting a logical change in a refresh address formed of said refresh address signals, a refresh clock generator for generating a basic clock signal for refresh operation, on the basis of the output of said transition detector circuit, and a control circuit which delivers a decoder activation signal for controllably activating said decoding means and a refresh address activation signal for controlling the transmission of said refresh address from said refresh address buffer to said decoding means, on the basis of said basic clock signal for refresh operation.

3. A semiconductor memory according to claim 2, wherein said semiconductor memory further comprises a regular address buffer for converting each of regular address signals into positive and negative signals, to transmit the output of said regular address buffer to said decoding means, a regular transition detector circuit for detecting a logical change in a regular address formed of said regular address signals, and a regular clock generator for generating a basic clock signal for regular operation, on the basis of the output of said regular transition detector circuit, to send said basic clock signal for regular operation to said control circuit, and wherein said control circuit includes means for outputting said decoder activation signal and a regular address activation signal for controlling the transmission of the regular address from said regular address buffer to said decoding means, on the basis of said basic clock signal for regular operation.

4. A semiconductor memory according to claim 3, wherein said control circuit includes means for canceling the refresh address activation signal and outputting the regular address activation signal when the basic clock signal for regular operation is inputted in an automatic refresh cycle.

5. A semiconductor memory according to claim 4, wherein said control circuit includes means for canceling the decoder activation signal at the same time as the refresh address activation signal is canceled and for outputting the decoder activation signal at the same time as the regular address activation signal is outputted.

6. A semiconductor memory according to claim 5, wherein said control circuit includes means for outputting the refresh address activation signal and the decoder activation signal if the basic clock signal for refresh operation is kept at an active state when one of said read operation and said write operation has been completed.

7. A semiconductor memory according to claim 6, wherein the pulse width of the basic clock signal for refresh operation is made equal to or greater than the sum of the pulse width of the decoder activation signal in a regular operation and twice the pulse width of the decoder activation signal in a refresh operation.

8. A semiconductor memory according to claim 2, wherein each of said memory cells includes two transfer MOS transistors connected to a pair of data lines and two driver MOS transistors whose inputs and outputs are cross-coupled to each other, wherein electric charge is supplied from one of said data lines to the high-potential node of a memory cell to refresh data stored in said memory cell, when a load MOS transistor connected to the data line is put to a non-conductive state after said data line has been precharged to a high potential, and wherein a potential difference between said data lines which is generated in a refresh operation is made small, to reduce power consumption necessary for precharging said data line.

9. A semiconductor memory according to claim 8, wherein the potential difference between said data lines which is generated in a refresh operation is made less than 1 V.

10. A semiconductor memory according to claim 1, wherein said decoding means includes a word driving means for driving word lines of said memory cell array, and wherein the number of word lines which are driven by said word driving means during said refresh operation is greater than that of word lines which are driven by said word driving means during said read operation and/or said write operation.

11. A semiconductor memory according to claim 1, further comprising means for supplying a current to a bit line of said memory cell array, and wherein a current supplying capability of said current supplying means during said refresh operation is smaller than that of said current supplying means during said read operation and/or said write operation.

* * * * *